(12) United States Patent
Hansen et al.

(10) Patent No.: US 10,823,769 B2
(45) Date of Patent: Nov. 3, 2020

(54) METHOD OF DETERMINING POWER CONSUMPTION OF AN ELECTRICAL HEATING SYSTEM

(71) Applicant: OJ Electronics A/S, Sønderborg (DK)

(72) Inventors: Stefan Ott Hansen, Søndeborg (DK);
Anker Bo Christensen, Broager (DK)

(73) Assignee: OJ Electronics A/S, Sønderborg (DK)

( * ) Notice: Subject to any disclaimer, the term of this patent is extended or adjusted under 35 U.S.C. 154(b) by 256 days.

(21) Appl. No.: 15/549,830

(22) PCT Filed: Feb. 9, 2015

(86) PCT No.: PCT/EP2015/052629
§ 371 (c)(1),
(2) Date: Aug. 9, 2017

(87) PCT Pub. No.: WO2016/128018
PCT Pub. Date: Aug. 18, 2016

(65) Prior Publication Data
US 2018/0031616 A1     Feb. 1, 2018

(51) Int. Cl.
*G01R 21/08* (2006.01)
*G01R 15/20* (2006.01)
*F24D 19/10* (2006.01)

(52) U.S. Cl.
CPC ......... *G01R 21/08* (2013.01); *F24D 19/1096* (2013.01); *G01R 15/202* (2013.01); *F24D 2220/0257* (2013.01)

(58) Field of Classification Search
CPC ................................ G01R 21/08; G01R 15/20
See application file for complete search history.

(56) References Cited

U.S. PATENT DOCUMENTS

| | | | | |
|---|---|---|---|---|
| 4,288,990 A | * | 9/1981 | Schulz | G05D 23/1904 62/158 |
| 4,514,685 A | * | 4/1985 | Gilker | G01R 21/08 324/103 R |
| 4,804,957 A | * | 2/1989 | Selph | G01R 21/00 340/870.03 |
| 8,523,084 B2 | | 9/2013 | Siddaramanna et al. | |

FOREIGN PATENT DOCUMENTS

| | | |
|---|---|---|
| DE | 1286209 B | 1/1969 |
| DE | 102007017506 A1 | 10/2008 |
| EP | 2216606 A1 | 8/2010 |
| GB | 966300 A | 8/1964 |
| WO | 2013/014411 A2 | 1/2013 |

* cited by examiner

*Primary Examiner* — Neel D Shah
(74) *Attorney, Agent, or Firm* — Knobbe, Martens, Olson & Bear, LLP

(57) ABSTRACT

The invention relates to a method of determining power consumption of an electrical heating system, where the power consumption is defined by a reading of information from a conductor (4, 6) within a thermostat (1). The invention further relates to a thermostat comprising an element for determining the power consumption of an electrical heating system, where the thermostat (1) is provided with a reading element (5) for reading current from a conductor (4, 6) and a reading element (28) reading voltage from a transformer output.

17 Claims, 4 Drawing Sheets

METHOD OF DETERMINING POWER CONSUMPTION OF AN ELECTRICAL HEATING SYSTEM

CROSS-REFERENCE TO RELATED APPLICATIONS

This application is the U.S. National Phase under 35. U.S.C. § 371 of International Application PCT/EP2015/052629, filed Feb. 9, 2015. The disclosures of the above-described application are hereby incorporated by reference in their entirety.

FIELD OF THE INVENTION

The invention relates to a method of determining the power consumption of an electrical heating system.

Power consumption can be measured in different ways. A simple way to detect power consumption from electrical devices or appliances is to plug the electrical device or appliance into a power meter, which again is plugged into a power socket.

Another method is simply to take two or more readings from the electricity meter over a time period, but this method will only give a measure on the total power consumption on all electrical device or appliances connected to the power supply on a location.

To determine the power consumption on an electrical heating system, for example an electrical floor heating system, the system can be connected to a power meter, which is able to give readings about the power consumption of the heating system. Such a power meter will normally be installed in or placed next to a circuit breaker panel.

U.S. Pat. No. 8,523,084 B2 describes that an energy provider and/or an electrical meter may provide information to a thermostat in order to determine and show the cost of used energy or for example is currently being used over a designated period of time.

Hereby it is necessary to connect the thermostat to an electrical meter or the like in order to provide information about used energy, which involves uncertainty regarding which consuming elements are the source of the current usage of power or the total power consumption.

WO 2013/014411 A2 describes a heating element comprising a thermostat being part of a liquid heating system with the purpose of avoiding *Legionella* bacteria in a water vessel. The liquid heating system comprises a Hall effect sensor which may be used for getting a binary indicating of current running to of the heating element. The purpose is to determine the warm up time of the water vessel's contents. Furthermore it is disclosed that using a Hall effect sensor may not be the cheapest way of getting a binary indicating of current. A Feedback resistor, measuring differential voltage across it, is suggested as a cheaper alternative.

SUMMARY OF THE INVENTION

The overall purpose of measuring the power consumption of a heating device is to be able to determine if a heating device runs under acceptable conditions.

This is solved by the present invention by incorporating in the thermostat a measuring device for measuring the power consumption of the heating device controlled by the thermostat.

Hereby is provided a method of measuring or determining the power consumption of an electrical heating device where power consumption is defined by a reading of a signal or an impulse from a conductor through a transducer within a thermostat.

In an embodiment reading of a signal or an impulse from the conductor is based on impulses from a single conductor.

In an alternative embodiment reading of a signal or an impulse from the conductor is based on signals or impulses from two separate conductors.

In an embodiment the transducer is a Hall effect sensor.

In an embodiment a conductor is placed along at least two sides of the Hall effect sensor.

In an embodiment a conductor is placed along at least three sides of the Hall effect sensor.

The above embodiments give a stronger signal than only one conductor. The conductor can be provided with a number of windings close to the transducer to increase the strength of the signal.

In an embodiment a further conductor together with a first conductor surrounds the Hall effect sensor.

In an embodiment the signals or impulses are amplified and put through a filter, which filter is adapted to eliminate noise in an area near to or above 200 Hz.

When amplifying the signals also noise will be amplified. To be able to give reliable readings, the noise is removed or minimised by an electronic filter.

In an embodiment proportional voltage is measured at VDC by a reading element, which reading element performs a computation on input signals from the conductor, through the transducer and on input signals (VDC) available to the reading element.

In an embodiment the reading element is coupled up against ADC and a pull-up resistor (at VDC) to measure and to determine an input voltage from an AC supply to the electrical heating system.

Measuring or determining power consumption of a heating device is also accomplished by a thermostat comprising an element for determining power consumption of an electrical heating system, where the thermostat is provided with a transducer for reading current from a conductor and a reading element reading voltage from a transformer output.

In an embodiment of the thermostat the conductor comprises two parallel sections, one on each side of the transducer.

In an embodiment of the thermostat the conductor comprises a cord.

In an alternative embodiment of the thermostat the conductor comprises a part of a printed circuit board.

In an embodiment of the thermostat the transducer is a Hall effect sensor.

In an embodiment of the thermostat the thermostat comprises an operational amplifier.

In an embodiment the thermostat comprises a filter.

In an embodiment of the thermostat the filter is adapted to eliminate noise in an area near to or above 200 Hz.

In an embodiment the thermostat is provided with a reading element, which reading element performs a computation on input signals from the conductor, through the transducer and on input signals (VDC) available to the reading element.

In an embodiment of the thermostat the reading element is coupled up against an analog to digital converter and a pull-up resistor (at VDC) to measure and to determine an input voltage from an AC supply to the electrical heating The measuring device can be provided by a conductor placed near to a transducer.

In an aspect of the invention the transducer is a Hall effect sensor and the conductor is placed in a kind of loop following the outer contour of the hall element. When placing a conductor along a side of the Hall effect sensor, a side should be understood as any of the sides of the sensor.

To utilise the space available on the printed circuit board (PCB) in an optimised way, the selected transducer can be an integrated circuit comprising a Hall effect sensor.

The position of the conductor in relation to the transducer is important due to for example the strength of the signal to be read by the transducer. If the distance between the conductor and the transducer is increased, the strength of the signal will decrease. If the signal is weak due to the distance between the conductor and the transducer, the signal can be strengthened by use of an Operational Amplifier, also called an Op-amp. It is also possible to increase the strength of the electric field by providing more conductors or windings of conductors to the proximity of the transducer, and as an alternative even surrounding the transducer by conductors or conduction elements through which the signals flow. One way of doing so is to apply a number of layers of PCB's, each having a loop or curve of an essentially U-formed section of the conducting element. Here the transducer is placed between layers of the PCB, preferably having approximately the same number of layers at each side of the transducer.

If an Op-amp is used some disadvantages can occur since amplification of the signal will cause amplification of interfering noise. In such situations a filter is coupled to the transducer and/or to the circuit. A suitable filter can be a capacitor, which is a common way to eliminate noise in electrical equipment, but other elements with same capabilities can also be used.

The thermostat can be connected to a wireless home network making it possible to bring the thermostat in connection with similar thermostats in a house. Further individual thermostats or groups of thermostats can be connected to or linked up to a company server from the manufacturer of the thermostats.

The power measuring option in the thermostat makes it possible to send readings to the manufacturer of the thermostat facilitating for the manufacturer to communicate with the customer in order to detect malfunctions and to suggest amendments to the configuration of the thermostat in order to achieve more economical or environmental configurations of the thermostat, based on data from the manufacturers database. The data can for example comprise type of thermostat, size of room or house, time of season or similar data.

The thermostat can be configured to communicate only with server at manufacturer.

In an embodiment the thermostat can be controlled by a PDA via server at manufacturer.

This can give the user the possibility of login to a server at the manufacturer and generate a usage report based on data stored at the server.

The signature or account for login to a server at the manufacturer can be the users e-mail address.

The server at manufacturer does not need to be situated at the premises of the manufacturer, but the server is administrated by the manufacturer or the provider of the thermostats.

In an embodiment the transducer can be arranged in same manner as in an ampere meter or ammeter shunt. An ammeter shunt is used in case a current to be measured by a certain ammeter is too high or large. In such a shunt of accurately known resistance is placed in series with a load, whereby all of the current to be measured will flow through it. A voltage drop across the shunt will thereby be proportional to the current flowing through the load and since its resistance is known, a voltmeter connected across the shunt can be scaled to directly display the current value.

Main supply voltage is also measured to be able to make a power calculation.

A Switch Mode Power Supply (SMPS) MOSFET is conducting voltage on input capacitance, and is transformed to a secondary winding with a negative polarity. The most negative value will be available at a capacitor minus a voltage drop over a diode. There will also be a small voltage drop over a resistor, which resistor is used to reduce the maximum current through the diode. An approximated equation for VDC is $$VDC = -\left(\frac{(\sqrt{2} \cdot Vac - 2 \cdot V_{D1}) \cdot Ns}{Np} - V_{D6}\right)$$

Voltage and current measurement (VOL_MEASURE) and (CUR_MEASURE) are two analog signals from a Power PCB.

The Switch Mode Power Supply makes it possible to have a precise indication of a proportional voltage measured at VDC by a reading element, which reading element performs a computation on input signals from the conductor, through the transducer and on input signals (VDC) available to the reading element.

Having the reading element coupled up against ADC and a pull-up resistor (at VDC) it is possible to measure and to determine an input voltage from an AC power supply to the electrical heating system.

In an embodiment the thermostat is provided with a reading element, which reading element performs a computation on input signals from the conductor, through the transducer and on input signals (VDC) available to the reading element.

In an embodiment of the thermostat the reading element is coupled up against an analog to digital converter and a pull-up resistor (at VDC) to measure and to determine an input voltage from an AC supply to the electrical heating system.

Further embodiments and advantages are disclosed below in the description and in the claims.

BRIEF DESCRIPTION OF THE DRAWINGS

The invention will now be described more fully below, by way of example only, with reference to the accompanying drawings, in which FIG. 1, schematically shows a thermostat to be placed for example on a wall.

DETAILED DESCRIPTION

Figure 1:
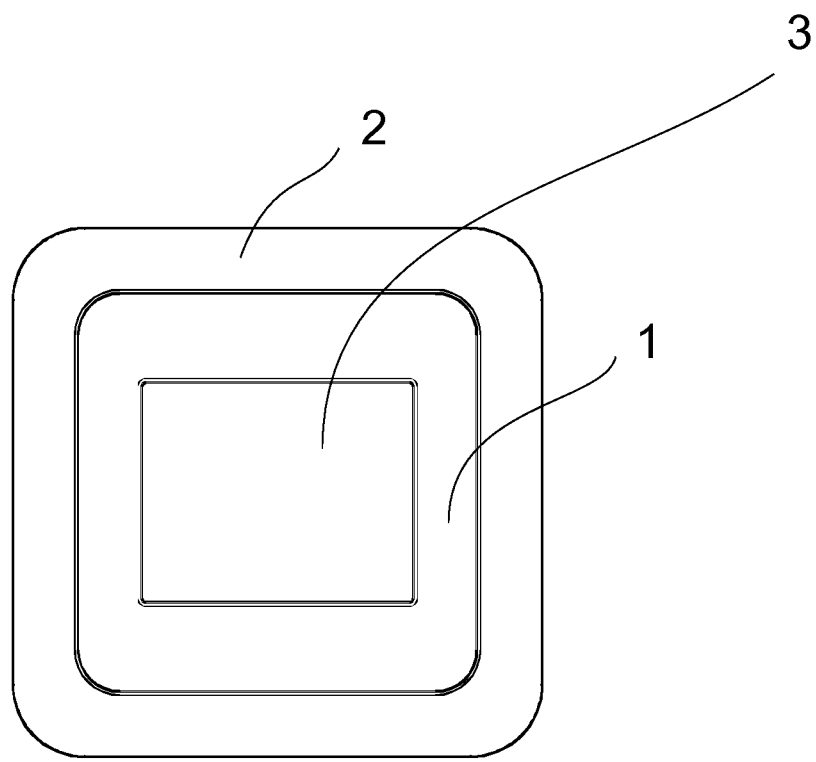
Figure 2:
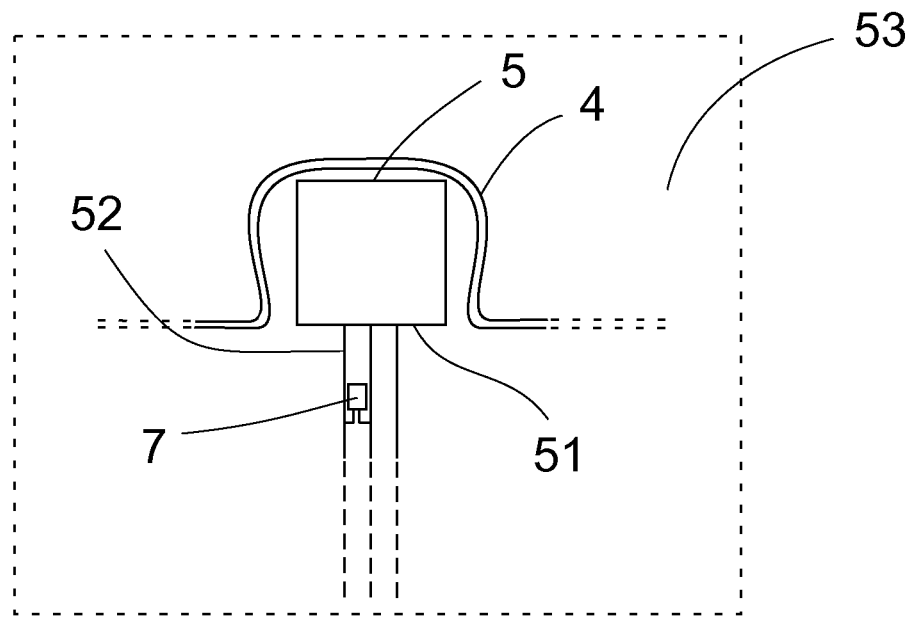
FIG. 2, schematically shows a layout of a conductor placed in relation to a transducer on a printed circuit board.
Figure 3:
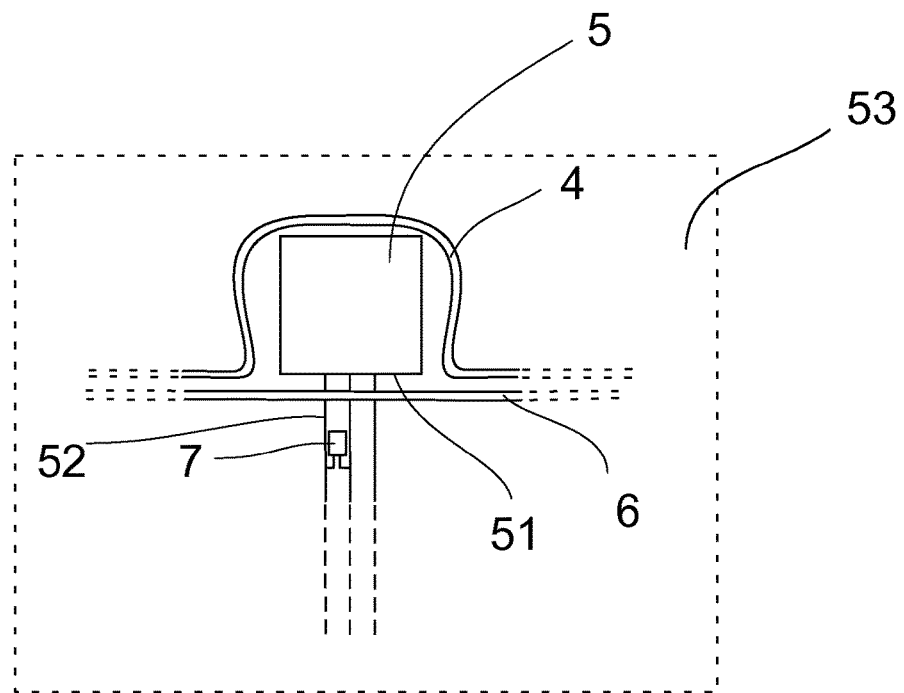
FIG. 3, schematically shows an alternative layout of conductors placed in relation to a transducer on a printed circuit board.

Now convenient embodiments of the invention will be described.

A method of measuring or determining power consumption of an electrical heating system is provided where the power consumption is defined by a reading of a signal or an impulse from a conductor 4, 6 through a transducer 5 within a thermostat 1.

In an embodiment of the method reading of a signal or an impulse from the conductor 4, 6 is based on impulses from a single conductor 4.

In an alternative embodiment of the method reading of a signal or an impulse from the conductor 4, 6 is based on signals or impulses from two separate conductors 4, 6.

In an embodiment the transducer 5 is a Hall effect sensor.

In an embodiment of the method a conductor 4, 6 is placed along at least two sides of the Hall effect sensor 5.

In an alternative embodiment of the method a conductor 4, 6 is placed along at least three sides of the Hall effect sensor 5.

In an alternative embodiment of the method a further conductor 6 together with a first conductor 4 surrounds the Hall effect sensor 5.

In an embodiment of the method the signals or impulses are amplified and put through a filter 7, which filter 7 is adapted to eliminate noise in an area near to or above 200 Hz.

In an embodiment of the method a proportional voltage is measured at VDC by a reading element 28, which reading element 28 performs a computation on input signals from the conductor 4, through the transducer 5 and on input signals (VDC) available to the reading element 28.

In an embodiment of the method the reading element 28 is coupled up against ADC and a pull-up resistor (at VDC) to measure and to determine an input voltage from an AC supply to the electrical heating system.

A thermostat 1 for controlling a heating device (not shown) comprises an element to be inserted in a housing provided for the thermostat 1 or in a frame 2. Thereby it is possible to mount the thermostat 1 on a wall or other suitable places. The thermostat is provided with a display 3. To facilitate use of the thermostat, for example during setting of the thermostat 1, the display 3 can be a touch screen display, thereby avoiding buttons, but the thermostat 1 can also be of the type with a kind of control panel provided with buttons for entering settings or changing display modes.

Within the thermostat 1 is incorporated a current measuring device 10 for measuring the power consumption of the heating device controlled by the thermostat 1.

The thermostat 1 is provided with a transducer 5 for reading current from a conductor 4, 6 and a reading element 28 reading voltage from a transformer output 28a from a transformer 11a.

The current measuring device 10 can be provided by a conductor 4 placed near to a transducer 5.

The conductor 4, 6 can comprise two parallel sections, one on each side of the transducer 5.

The conductor 4, 6 can comprise a cord or the conductor can comprise a part of a printed circuit board (PCB) 53 to which the transducer 5 is fastened.

In an aspect of the invention the transducer 5 is a Hall effect sensor and the conductor 4 is placed in a kind of loop following the outer contour of the Hall effect sensor 5.

In an alternative embodiment the conductor 4 and the transducer 5 can be moulded into a moulding compound to fixate their mutual distance and position.

To utilise space available on the printed circuit board 53 in an optimised way, the selected transducer 5 can be an integrated circuit comprising a Hall Effect sensor.

The transducer 5 is formed with a connecting side 51 comprising a number of connecting pins 52 to connect the transducer 5 to the printed circuit board 53.

In an embodiment a conductor 4 is placed close to at least one side of the transducer 5.

In an alternative embodiment the conductor 4 is placed close to three sides of the transducer 5.

In an alternative embodiment two conductors 4, 6 are placed close to the transducer 5. The transducer 5 is placed close to the conductor 4 and/or to the conductor 6 in order to pick up a sufficiently strong electric field, being strong enough so that variations in the electric field of the conductor due to power consumption of the heating system can be measured or detected through the transducer The thermostat is manufactured to determine power consumption at voltages at least in the interval from 100 V to 240 V+−15%.

It is important that if the voltage is not measured or determined by the thermostat that the correct level of voltage is entered/coded into the thermostat during setting or programming the thermostat at point of use.

The position of the conductor 4 in relation to the transducer 5 is important due to, for example strength of a signal to be read by the transducer 5. If the distance between the conductor 4 and the transducer 5 is increased, the strength of the signal will decrease. If the signal is weak due to the distance between the conductor 4 and the transducer 5, the signal can be strengthened by use of an Operational Amplifier, also called an Op-amp.

If an Op-amp is used some disadvantages can occur since amplification of the signal will cause amplification of interfering noise. In such situations a filter 7 is coupled directly to pins of the transducer 5 and/or to the circuit. A suitable filter 7 can be a capacitor, which is a common way to eliminate noise in electrical equipment, but other elements with same capabilities can also be used.

In an embodiment a filter 7 for suppressing noise in an area around and above 200 Hz is selected. In this area signals will be more noise filled, especially when output voltage is low.

The thermostat 1 can be connected to a wireless home network (not shown) making it possible to bring the thermostat 1 in connection with similar thermostats in a house. Further individual thermostats or groups of thermostats can be connected to or linked up to a company server from the manufacturer of the thermostats.

The power measuring option in the thermostat 1 makes it possible to send readings to the manufacturer of the thermostat facilitating for the manufacturer to communicate with a customer (user) in order to detect malfunctions and to suggest amendments to configuration of the thermostat 1 in order to achieve more economic or environmental configurations of the thermostat 1, based on data from the manufacturers database. The data can for example comprise type of thermostat, size of room or house, time of season or similar data.

Figure 4:
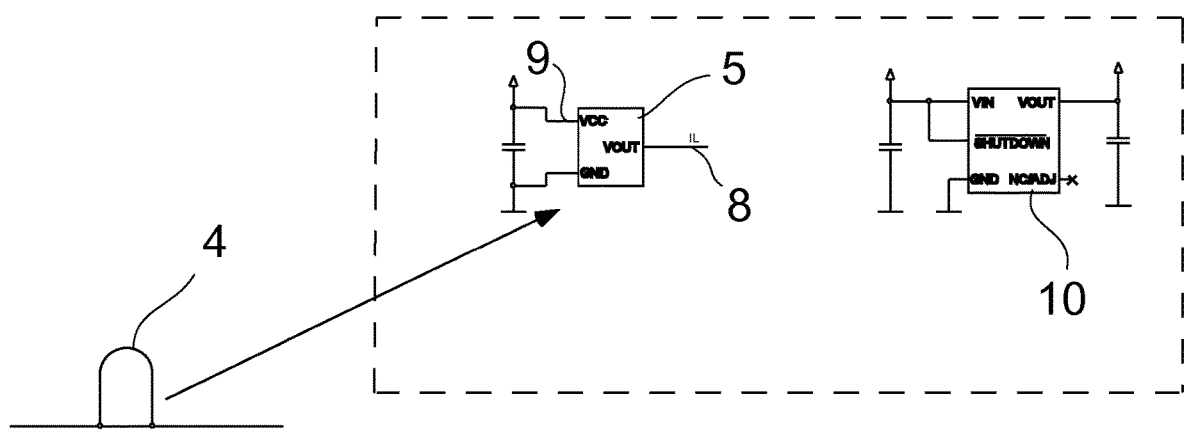
FIG. 4, schematically shows an embodiment of a transducer in relation to a conductor.

An example is shown in FIG. 4. The values mentioned in the example are relating to a specific embodiment, further embodiments can make use of different values. Here VOUT/IL is a voltage proportional to an applied electric field with a quiescent voltage of half the supply voltage. The sensitivity is 5 mV/G (gauss) and the electric field is mainly generated from the current going through the looped conductor 4. The Hall effect sensor 5 is placed close to or inside a loop or curve of an essentially U-formed section of the conducting element 4, the conducting element being a cord or a conducting element being a part of the layout of a printed circuit board 53, where the electric field is added together preferably all way around the Hall effect sensor 5. There is also a small contribution from other high current connections within the thermostat 1, but the value is dependent on the direction of the electric field and the distance from the electric field and to the transducer 5. The nearest current path will therefore add positive to the signal. The output is an AC signal of 50/60 Hz.

Figure 7:
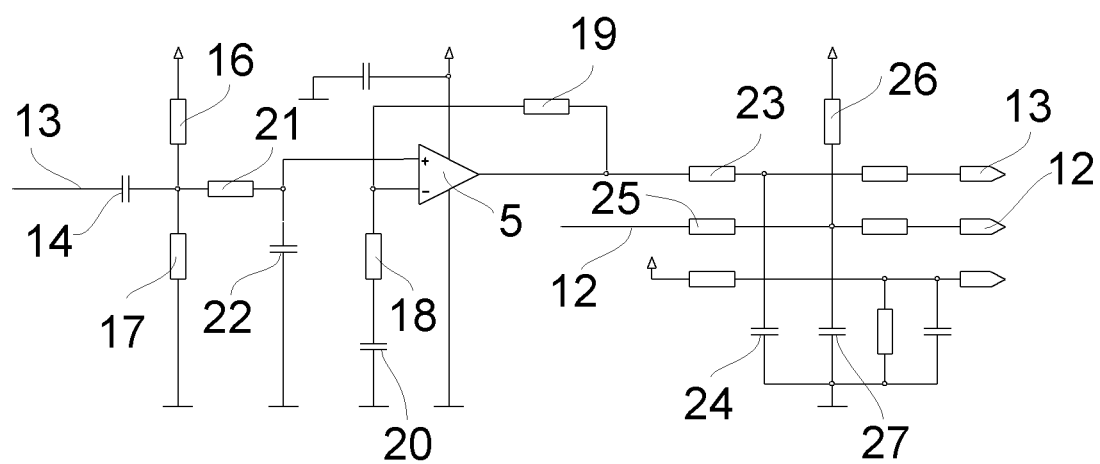
FIG. 7, schematically shows a measuring circuit in relation to the embodiments shown in FIGS. 2 and 3.

The electric field from a relay coil is also added to the signal, but since this is a constant field without influence on the AC value, only on the quiescent part which is filtered out by a display circuit (PCB) shown in FIG. 7.

VOUT/IL 8 is proportional to VCC 9. To prevent changes on the SMPS output voltage to influence the output, the supply voltage (VCC) is filtered through a regulator, which regulator can be a low-dropout linear regulator 10, as shown in FIG. 4.

To maintain galvanic isolation the transducer 5 is mounted on the opposite side of the loop or curve of an essentially U-formed section of the conducting element 4 on the PCB 53.

In an alternative embodiment the strength of the electric field can be increased by providing more conductors or windings of conductors to the proximity of the transducer 5, and as an alternative even surrounding the transducer 5. One way of doing so is to apply a number of layers of PCB's 53, each having a loop or curve of an essentially U-formed section of the conducting element 4. Here the transducer is placed between layers of the PCB, preferably having approximately the same number of layers at each side of the transducer.

Main supply voltage is also measured to be able to make a power calculation.

Figure 5:
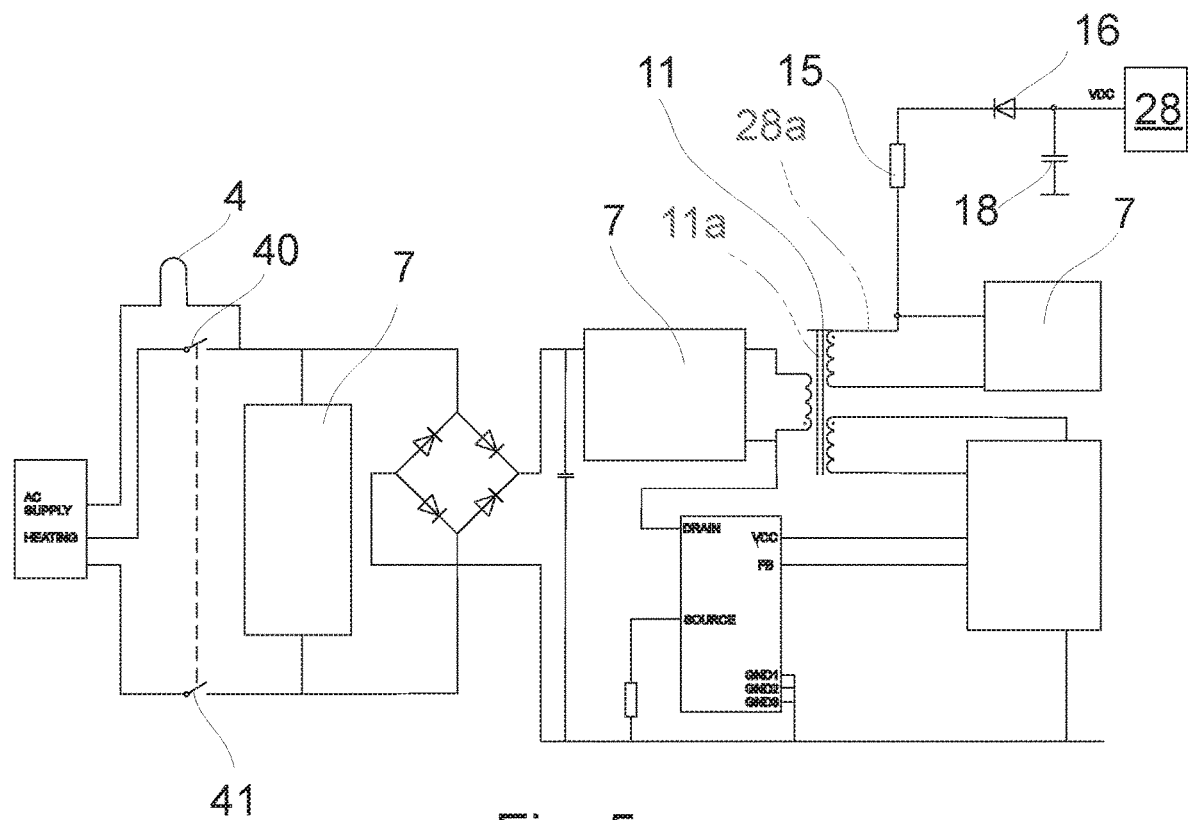
FIG. 5, schematically shows an embodiment of a layout for measuring or determining power consumption of an electrical heating system.
Figure 6:
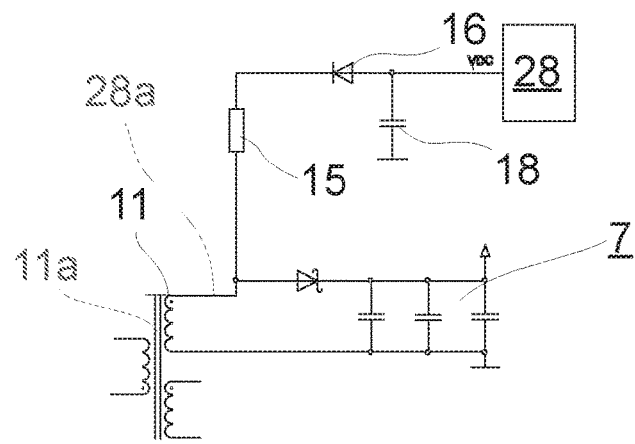
FIG. 6, schematically shows a part of the circuit shown in FIG. 5.

A Switch Mode Power Supply (SMPS) MOSFET is conducting voltage on input capacitance as shown in FIG. 5 and is transformed to a secondary winding 11 with a negative polarity. The most negative value will be available at capacitor 18 minus the voltage drop over diode 16. There will also be a small voltage drop over resistor 15, but this resistor is necessary to reduce the maximum current through diode 16. An approximated equation for VDC is $$VDC = -\left(\frac{(\sqrt{2} \cdot Vac - 2 \cdot V_{D1}) \cdot Ns}{Np} - V_{D6}\right)$$

Voltage and current measurement (VOL_MEASURE) 12 and (CUR_MEASURE) 13 are two analog signals from a Power PCB, schematically shown in FIG. 7.

The Switch Mode Power Supply, having switches 40, 41, makes it possible to have a precise indication of a proportional voltage measured at VDC by a reading element 28, which reading element 28 performs a computation on input signals from the conductor 4, through the transducer 5 and on input signals (VDC) available to the reading element 28.

In an embodiment the thermostat is provided with a reading element 28, said reading element 28 performs a computation on input signals from the conductor 4, through the transducer 5 and on input signals (VDC) available to the reading element 28.

In an alternative embodiment the reading element 28 is coupled up against an analog to digital converter and a pull-up resistor (at VDC) to measure and to determine an input voltage from an AC supply to the electrical heating system.

Having the reading element 28 coupled up against ADC and a pull-up resistor (at VDC) it is possible to measure and to determine the input voltage from the AC supply to the heating system.

The values mentioned in the example are relating to a specific embodiment, further embodiments can make use of different values.

The current signal is AC coupled at 14 to add a bias voltage over resistors 16 and 17 of 1.6V to be able to use the full scale of an analog to digital converter (ADC). The AC part of the signal is then amplified with a factor 16 (resistor 18, 19 inverting) and fed to the ADC where the DC part is unaltered (capacitor 20 and resistor 18 adds a 1.6 KHz high pass filter 7). Resistor 21/capacitor 22 and resistor 23/capacitor 24 acts as low pass filters to remove noise above 1 KHz, especially some 90 KHz noise from the Hall effect sensor 5.

Current measurement can be optional and may be "not mounted". The relevant components are on both PCBs.

The voltage signal (VOL_MEASURE) 12 has a value between −23V and −6V. Resistor 25 and pull-up on resistor 26 converts this to values between 0.4V and 2.1V (low value for high mains voltage) for the ADC. Capacitor 27 filters out noise above 1.5 KHz.

The thermostat 1 can be configured to communicate only with a server at the manufacturer.

In an embodiment the thermostat 1 can be controlled by a PDA via a server at the manufacturer.

This can give the user the possibility to login in a server at the manufacturer and generate a usage report based on data stored at the server.

The signature or account for login to a server at the manufacturer can be the users e-mail address.

What is claimed is:

1. A method of determining power consumption of an electrical heating system having a thermostat comprising:
   an element for determining power consumption of the electrical heating system,
   a transducer, and
   a conductor, the method comprising:
   reading signals or impulses within the thermostat,
   amplifying the signals or impulses, and
   putting the amplified signals or impulses through a filter to eliminate noise in an area near to or above 200 Hz.

2. The method according to claim 1, wherein, reading the signals or impulses from the conductor is based on impulses from a single conductor.

3. The method according to claim 1, wherein, reading the signals or impulses from the conductor is based on signals or impulses from two separate conductors.

4. The method according to claim 1, wherein, the transducer is a Hall effect sensor.

5. The method according to claim 4, wherein, a conductor is placed along at least two sides of the Hall effect sensor.

6. The method according to claim 4, wherein, a conductor is placed along at least three sides of the Hall effect sensor.

7. The method according to claim 6, wherein, a further conductor together with a first conductor surrounds the Hall effect sensor.

8. The method according to claim 1, wherein, a proportional voltage is measured at VDC by a reading element, which reading element performs a computation on input signals from the conductor, through the transducer and on input signals (VDC) available to the reading element.

9. The method according to claim 8, wherein, the reading element is coupled up against ADC and a pull-up resistor to measure and to determine an input voltage from an AC supply to the electrical heating system.

10. A thermostat comprising:
- an element for determining power consumption of an electrical heating system,
- a transducer,
- a conductor,
- a reading element,
- an operational amplifier, and
- a filter, which is adapted to eliminate noise having a frequency near to or above 200 Hz, wherein the transducer is configured for reading current from the conductor and the reading element is configured for reading voltage from a transformer output.

11. The thermostat according to claim 10, wherein, the conductor comprises two parallel sections, one on each side of the transducer.

12. The thermostat according to claim 10, wherein, the conductor comprises a cord.

13. The thermostat according to claim 10, wherein, the conductor comprises a part of a printed circuit board.

14. The thermostat according to claim 10, wherein, the transducer is a Hall effect sensor.

15. The thermostat according to claim 10, wherein, the thermostat is provided with the reading element, which reading element performs a computation on input signals from the conductor, through the transducer and on input signals (VDC) available to the reading element.

16. The thermostat according to claim 10, wherein, the reading element is coupled up against an analog to digital converter and a pull-up resistor at VDC to measure and to determine an input voltage from an AC supply to the electrical heating system.

17. The thermostat according to claim 10, wherein the thermostat is configured for being arranged on and to be accessible from inside walls of a building so as to act as a control panel provided with buttons for the user to enter settings or change display modes.

\* \* \* \* \*